United States Patent [19]
Jun et al.

[11] Patent Number: 6,060,928
[45] Date of Patent: May 9, 2000

[54] DEVICE FOR DELAYING CLOCK SIGNAL

[75] Inventors: Young Hyun Jun, Seoul; Hoi Jun Yoo, Taejeon-kwangyoksi, both of Rep. of Korea

[73] Assignee: LG Semicon Co., Ltd., Cheongju, Rep. of Korea

[21] Appl. No.: 09/124,912

[22] Filed: Jul. 30, 1998

[30] Foreign Application Priority Data

Apr. 25, 1998 [KR] Rep. of Korea ............ 98-14844

[51] Int. Cl.[7] ...................... H03H 11/26
[52] U.S. Cl. ............ 327/261; 327/152; 327/276; 327/291
[58] Field of Search ................ 327/141, 144, 327/145, 147, 149, 150, 151, 152, 153, 160, 161, 165, 166, 231, 237, 261, 265, 273, 276, 279, 286, 291, 293, 294, 299

[56] References Cited

U.S. PATENT DOCUMENTS 5,526,393 6/1996 Konodo et al. ............ 377/118
5,534,809 7/1996 Watanabe et al. ........... 327/269

OTHER PUBLICATIONS

Takanori Saeki et al.; "A 2.5-ns Clock Access, 250-MHz, 256-Mb SDRAM with Synchronous Mirror Display;" IEEE Journal of Solid-State Circuits, vol. 31, No. 11, Nov. 1996; pp. 1656–1668.

Ian Young et al.; "A PLL Clock Generator with 5 to 110 MHz of Lock Range for Microprocessors;" IEEE Journal of Solid–State Circuits, vol. 27, No. 11, Nov. 1992; pp. 1599–1607.

Thomas H. Lee et al.; "A 2.5 V CMOS Delay–Locked Loop for an 18 Mbit, 500 Megabyte/s DRAM;" IEEE Journal of Solid State Circuits, vol. 29, No. 12, Dec. 1994; pp. 1491–1496.

*Primary Examiner*—Jeffrey Zweizig
*Attorney, Agent, or Firm*—Fleshner & Kim

[57] ABSTRACT

Device for delaying a clock signal using a ring delay is disclosed. The device can include a delay for delaying an external clock signal eCLK as much as time delays d1+d2 of a time delay d1 occurring on reception and a time delay d2 occurring on driving an output buffer, a pulse generator for receiving the clock signal from the delay and generating rectangular pulses synchronous to rising edges, and a ring delay having a plurality of unit delays connected in a ring form for delaying and circulating the pulse signal generated in the pulse generator as well as latching a signal from each unit delay synchronous to the clock signal rCLK received in the chip. The first clock signal delay is for delaying the clock signal rCLK in a course corresponding to a number of circulation, and a second clock signal delay is for making a fine delay of the clock signal from the first clock signal delay in response to a latch signal from the ring delay. A reset signal generator is for resetting the ring delay and the first, and second clock signal delays in response to the clock signal rCLK.

6 Claims, 6 Drawing Sheets

DEVICE FOR DELAYING CLOCK SIGNAL

BACKGROUND OF THE INVENTION

1. Field of the Invention

The present invention relates to a semiconductor memory protocol, and more particularly, to a device for delaying a clock signal using a ring delay.

2. Discussion of the Background Art

In general, a clock signal is required for reading a data in a memory, which is provided externally. However, the clock received from outside of a chip is delayed for a certain time due to actual characteristics of pins or an internal circuit.

FIG. 1 illustrates a data read timing diagram for a background art SDRAM.

When reading a data from the chip using the external clock signal, a time delay is occurred naturally at a moment when an external clock signal is provided to the chip, and, alikely, a time delay is also occurred when an output buffer is driven for reading the data. Thus, there are cases when the data can not be read. That is, after having a certain time period of TAC (Time Access from Clock) at a rising edge of the clock signal, the data is taken from the system at a moment of the next rising edge (a data strobe time of the system). Despite a data output time to the clock should be stable regardless of a frequency, $TAC \geq tCLK$ is occurred if the frequency is high, which does not allow the intended data reading. Therefore, in order to make $TAC \leq tCLK$, it is necessary to pull a timing of the external clock signal provided to inside of the chip forward. The time delay is an important parameter for reading data in the memory, and particularly, a clock access time is an important parameter for a fast SDRAM. The clock skew due to the propagation delay through clock buffer and driver must be compensated for fast clock access. Phase locked loop (PLL) and delay locked loop (DLL) have been widely used to compensate the clock skew. However, for exact locking, they require more than 50 clock cycles, which increase the standby current.

Such a background art synchronous mirror delay line will be explained with reference to the attached drawing. FIG. 2 illustrates a system of the background art synchronous mirror delay line.

When an external clock is received in a chip, the clock signal is delayed for a certain time due to the foregoing reasons, naturally. And, there is a time delay at a moment an output buffer is driven for reading data from a memory, naturally. Accordingly, though they are not present in the circuit actually, buffers 1 and 2 are provided in FIG. 2 for explaining the naturally occurring time delays. d1 and d2 are the time delays, eCLK is an external clock signal, and rCLK is a clock signal received inside of the chip. The background art synchronous mirror delay line is provided with a delay 3 for delaying an external clock signal for the d1+d2, a TDC (Time to Digital Converter) 4 synchronous to the internal clock signal rCLK for digitizing a time period of the clock signal delayed in the delay 3, and a flipflop part 6 for latching signals from the TDC 4 and the DTC 5 in response to the internal clock signal rCLK.

Operation of the background art synchronous mirror delay line will be explained. FIG. 3 illustrates a timing diagram of a background art TDC and a clock cycle, and FIG. 4 illustrates waveforms of different parts in the background art synchronous mirror delay line.

The external clock signal eCLK is received in the chip with a certain time d1 delay as internal clock signal rCLK (see rCLK in FIG. 4). And, the internal clock signal rCLK delayed for a certain time is provided to the TDC 4 through the delay 3. In this instance, the clock signal at "A" point shown in FIGS. 2 and 4 after the delay 3 is provided to the TDC 4 after being delayed for d1+d2 from the clock signal rCLK. The TDC 4 measures tCLK–(d1+d2) and converts into a digital delay count. That is, each flipflop F/F in the flipflop part 6 latches a signal from one of unit delays tpd in the TDC 4, so that a "high" clock is latched at only one of the plurality of flipflops F/F at a moment when the internal clock is at a rising edge. The TDC 4 uses this in measuring the tCLK–(d1+d2) and converts the tCLK–(d1+d2) into a digital delay count (see FIG. 4 waveform B). And, the DTC 5 receives the measured digital delay count as a control signal and delays the clock signal received for locking an output of the clock driver to the external clock as much as tCLK–(d1+d2), again (see FIG. 4 waveform C). Therefore, the clock signal driving the output buffer at the end is delayed for the naturally delayed time period d2 (see FIG. 4 waveform liCLK). Thus, a timing of an external clock signal provided to the chip is pulled forward. In the meanwhile, as shown in FIG. 3, a time resolution of the DTC 5 is the same with the time delay of a unit delay tpd that determines a jitter of the internal clock. That is, as shown in FIG. 3, a condition as $Ntpd \geq tCLK \geq d1+d2$ (time delays in the delay part)+(F/F set time) provides a range of operation for locking the clock. The tpd should be small for reducing the jitter, and N should be small when the range of operation is great. If the tpd is 100 ps, the N should be equal to or greater than 200 for locking the 50 MHz external clock. As the DTC 5 requires unit delays the same as a number of the TDC 4, a total number of the unit delays of delay lines is 2N.

The aforementioned background art synchronous mirror delay line has the following problems.

That is, since the tpd should be small for reducing jitter, a number N of tpd should be great for a greater range of operation, and the DTC 5 requires the same number of unit delays as the TDC 4, which requires a 2N number of total unit delays in the delay line as well as an N number of flipflops F/F for processing data. Thus, the delay line consumes much silicon area.

SUMMARY OF THE INVENTION

Accordingly, the present invention is directed to a device for delaying a clock signal that substantially obviates one or more of the problems due to limitations and disadvantages of the related art.

An object of the present invention is to provide a device for delaying a clock signal which can reduce numbers of flipflops and unit delays for use in data processing.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the device for delaying a clock signal includes a delay for delaying an external clock signal eCLK as much as time delays d1+d2 of a time delay d1 naturally occurred on reception and a time delay d2 naturally occurred on driving an output buffer, a pulse generator for receiving the clock signal from the delay and generating rectangular pulses synchronous to rising edges, a ring delay having a plurality of unit delays connected in a ring form for delaying and circulating the pulse signal generated in the pulse generator as well as latching a signal from each unit delay synchronous to the clock signal rCLK received in the chip, a first clock signal delay for delaying the clock signal rCLK in a course corresponding to a number of circulation, a second clock signal delay for making a fine delay of the clock signal from the first clock signal delay in response to a latch signal from the ring delay, and a reset signal generator for resetting the ring delay and the first, and second clock signal delays in response to the clock signal rCLK.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
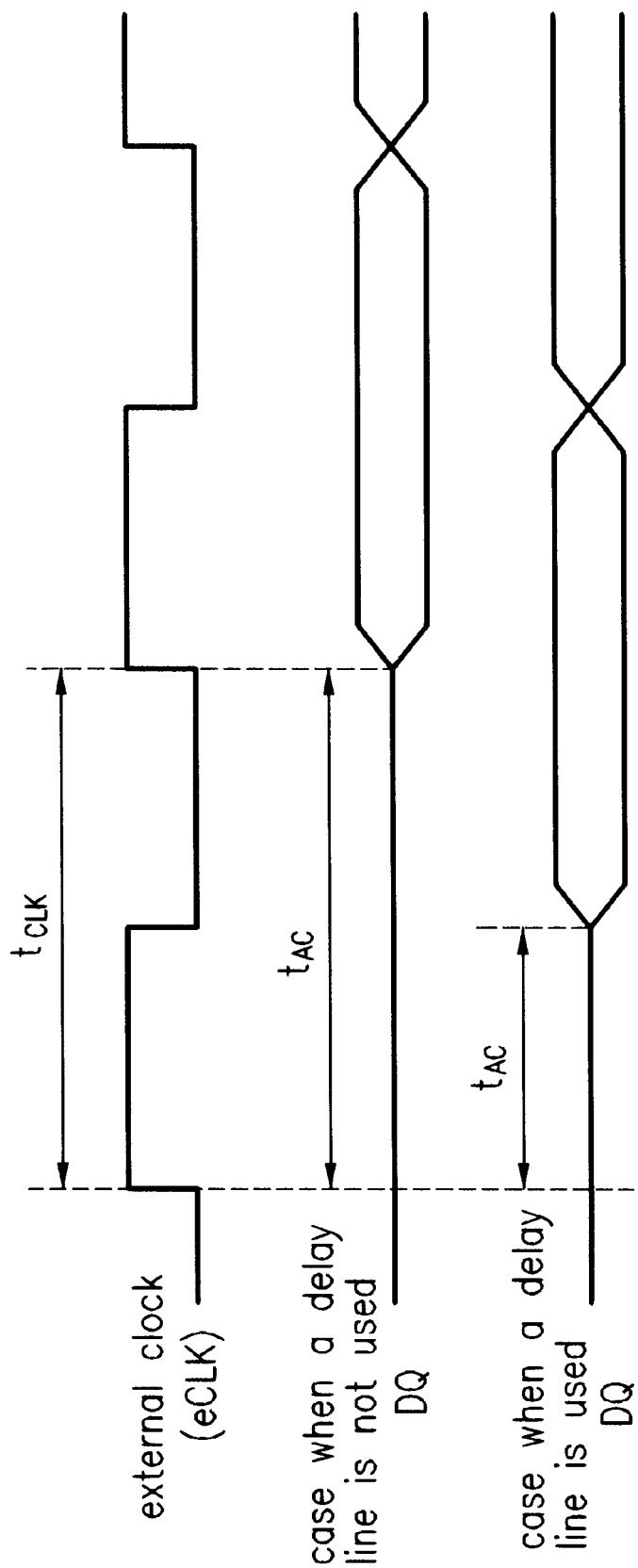
FIG. 1 illustrates a data read timing diagram for a background art SDRAM.
Figure 2:
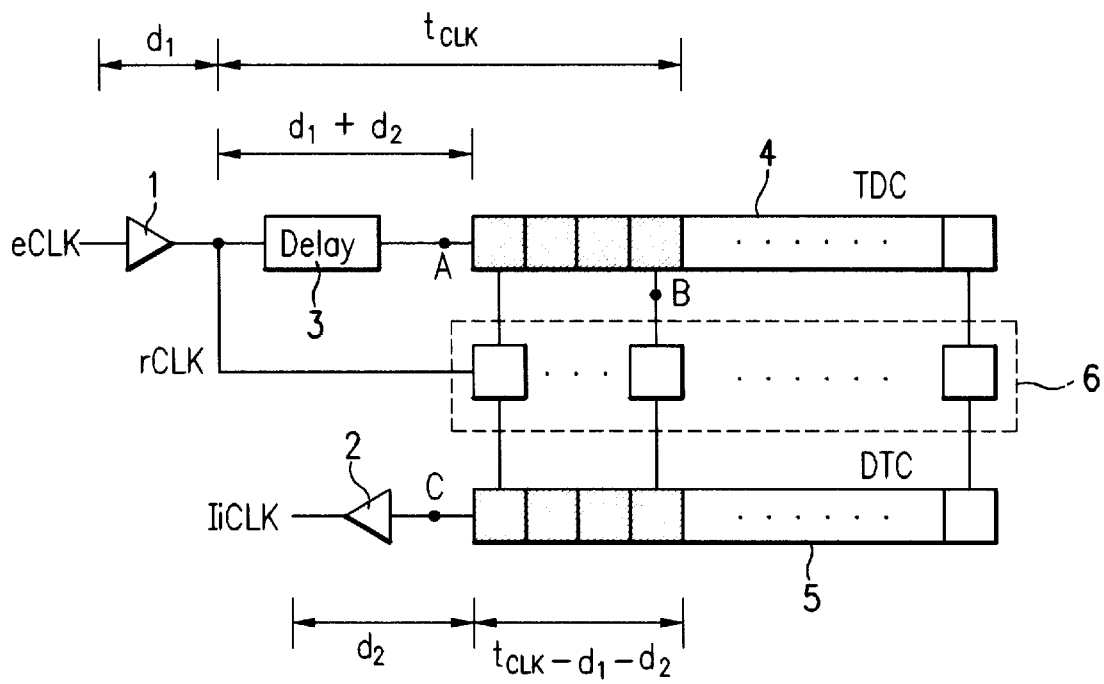
FIG. 2 illustrates a system of the background art linear delay line.
Figure 3:
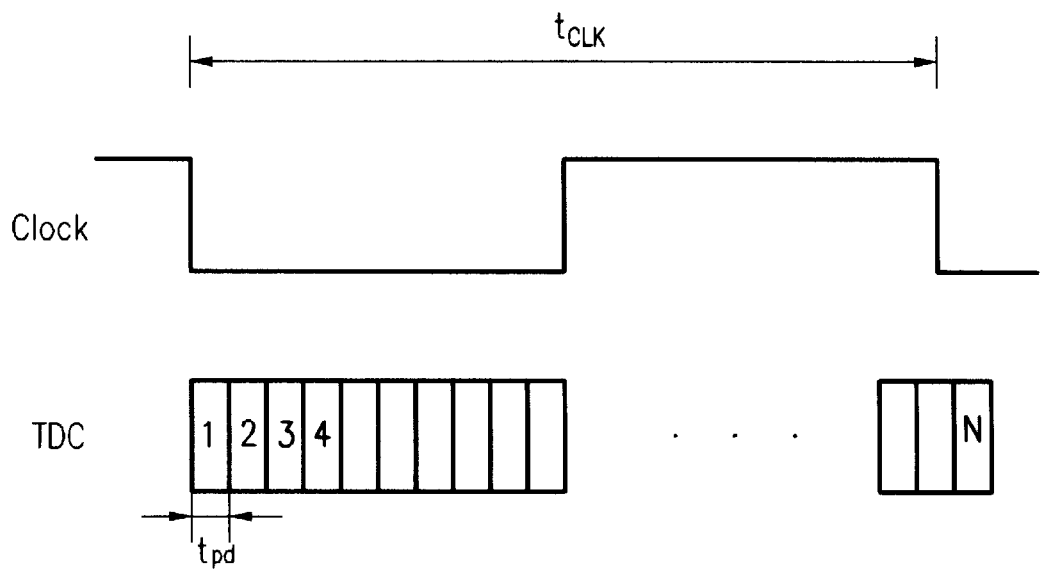
FIG. 3 illustrates a timing diagram of a background art TDC and a clock cycle.
Figure 4:
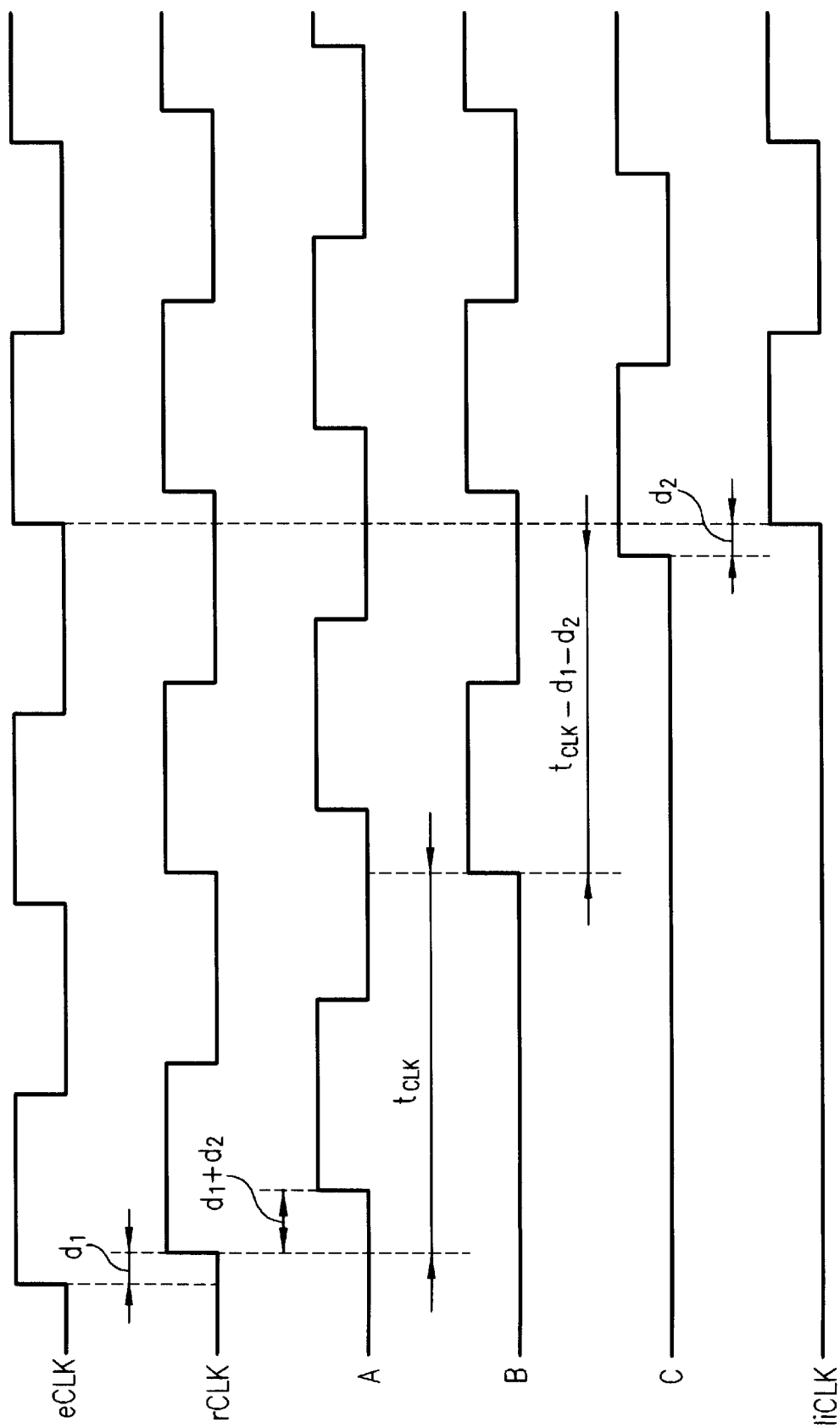
FIG. 4 illustrates waveforms of different parts in the background art linear delay line.
Figure 5:
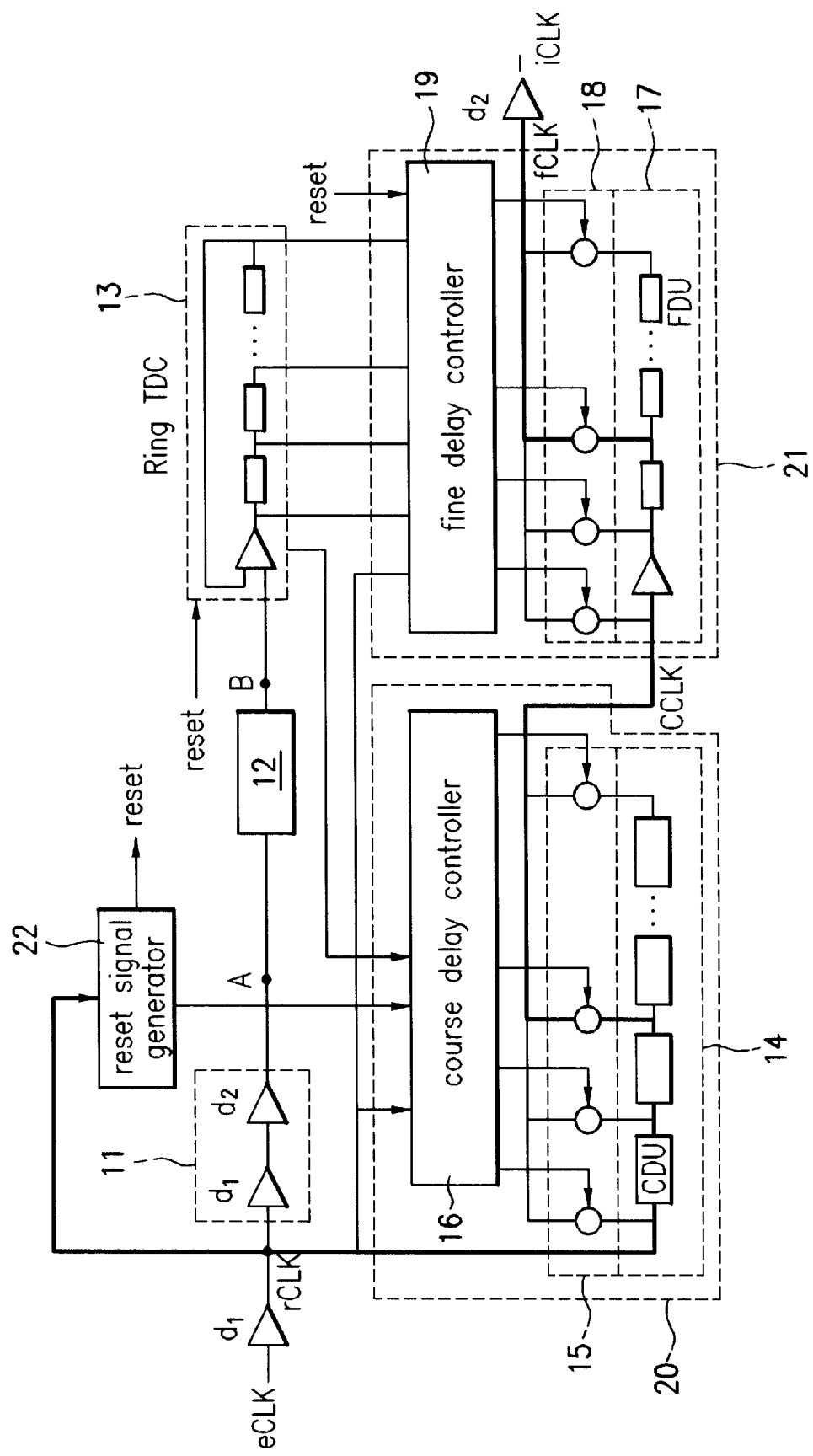
FIG. 5 illustrates a system of a device for delaying a clock signal in accordance with a preferred embodiment of the present invention.

Reference will now be made in detail to the preferred embodiments of the present invention, examples of which are illustrated in the accompanying drawings. FIG. 5 illustrates a system of a device for delaying a clock signal in accordance with a preferred embodiment of the present invention, and FIG. 6 illustrates a detailed system of the ring delay part shown in FIG. 5.

Referring to FIG. 5, a device for delaying a clock signal in accordance with a preferred embodiment of the present invention includes a delay 11 for delaying an external clock signal eCLK as much as time delays d1+d2. The time delay d1 naturally occurred on reception and a time delay d2 naturally occurred on driving an output buffer. The preferred embodiment of the device for delaying a clock signal also includes a pulse generator 12 for receiving the clock signal from the delay 11 and generating rectangular pulses synchronous to rising edges, a ring delay 13 having a ring of unit delays tpd and flipflops F/F for circulating the pulse signal generated in the pulse generator 12 as well as latching a signal of each unit delay tpd synchronous to the clock signal rCLK received in the chip and delayed for the time period d1. A first clock signal delay 20 for providing the clock signal rCLK with a time delay into a course of circulation every time the pulse signal make one circulation in the ring delay 13, and a second clock signal delay 21 adapted to determine signals latched at the flipflops F/F in the ring delay 13 for fine delay of the clock signal from the first clock signal delay 20 depending on a position of a "high" signal of the pulse. A reset signal generator 22 is adapted to receive the internal clock signal for resetting the ring delay 13 and the first, and second clock signal delays 20 and 21. The first clock signal delay 20 includes a course delay 14 having course delay units CDU for keep delaying the clock signal rCLK in fixed course, a first switching part 15 having a number of switching units corresponding to a number of the course delay units CDUs in the course delay 14 for respectively switching outputs of the course delay units CDUs in the course delay 14, and a course delay controller 16. The course delay controller 16 is for controlling the first switching part 15 so as to count a number of circulation of the pulse signal in the ring delay 13 for making a course delay for a time period corresponding to the number. The second clock signal delay 21 includes a fine delay 17 having a number of fine delay units FDUs the same as a number of unit delays tpd in the ring delay 13 for making fine delay of the clock signal from the first switching part 15, a second switching part 18 having a number of switching units corresponding to the number of the fine delay units FDUs in the fine delay 17 for respectively switching outputs of the fine delay units FDUs in the fine delay 17, and a fine delay controller 19. The fine delay controller 19 is for controlling the second switching part 18 so as to receive a signal latched at and provided from the flipflop F/F in the ring delay 13 in determining a latching flipflop F/F that latched the pulse generated in the pulse generator 12 and opening a switching unit corresponding to the latched flipflop.

Figure 6:
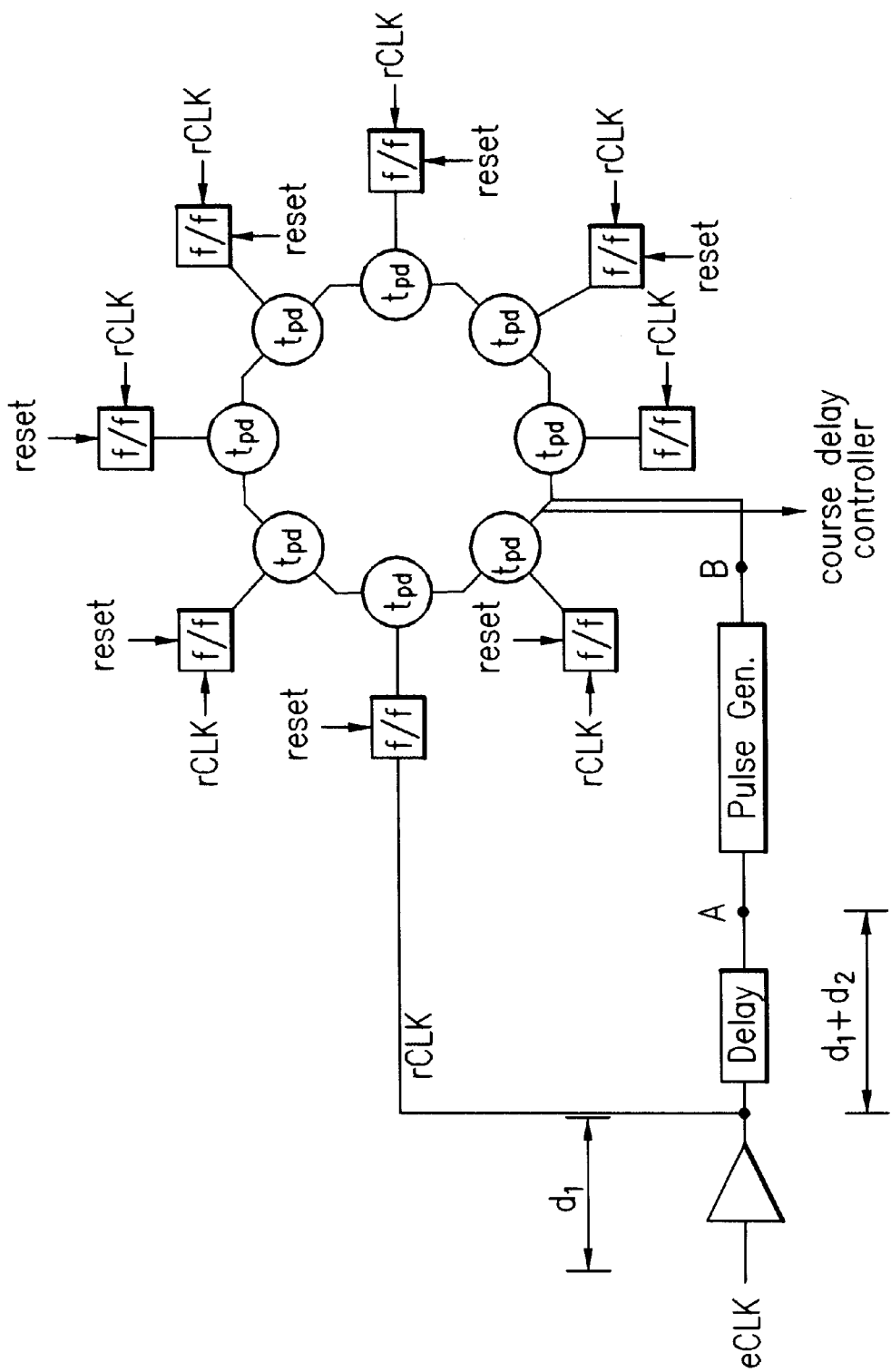
FIG. 6 illustrates a detailed system of the ring delay shown in FIG. 5.

FIG. 6 illustrates a detailed system of the ring delay 13 shown in FIG. 5.

That is, in this preferred embodiment of the present invention, 8 unit delays tpd are preferably connected in a ring form for circulating an input signal, and each of the unit delays tpd is connected to a flipflop f/f for latching a signal from the respective unit delay of the unit delays tpd synchronous to the internal clock rCLK.

Figure 7:
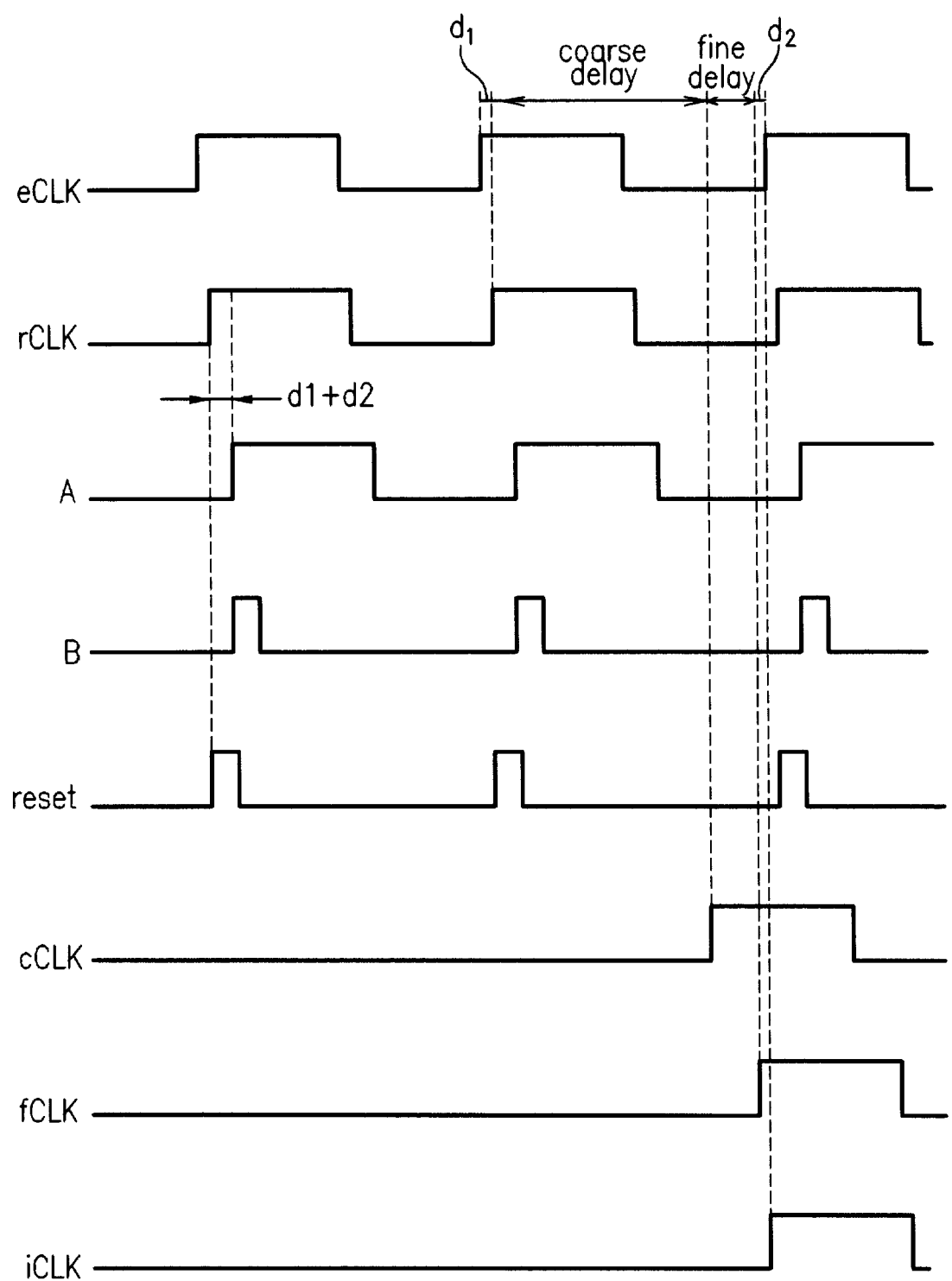
FIG. 7 illustrates waveforms of different parts in the device for delaying a clock signal of the present invention.

The operation of the aforementioned device for delaying a clock signal will be explained. FIG. 7 illustrates waveforms of different parts in the device for delaying a clock signal of the present invention.

An external clock signal eCLK is naturally delayed as it enters into a chip for a certain time period d1 and, alikely, naturally delayed for a certain time period d2 when an output buffer is driven. Therefore, the delay 11 delays the external clock signal eCLK as much as the natural time delay d1+d2 (see FIG. 7 waveform A) and the pulse generator 12 generates rectangular pulses synchronous to rising edges of the clock signal from the delay 11 and provides the rectangular pulses to the ring delay 13 (see FIG. 7 waveform B). The ring formed ring delay 13 circulates the pulse signal generated in the pulse generator 12 and latches a signal from each unit delay tpd synchronous to the clock signal rCLK that is delayed for the time period d1 and received inside of the chip. That is, a pulse circulation signal is provided to the course delay controller 16 and a signal latched at each flipflop is provided to the fine delay controller 19. In this instance, the course delay 14 keeps delaying the internal clock signal rCLK in a fixed course, and the course delay controller 16 counts the pulse signal circulating in the ring delay 13 and selectively turns on the switching units in the first switching part 15 for making a course delay as much as a time period corresponding to the count (cCLK). And, the clock signal from the first switching part 15 is subjected to a fine delay in the fine delay 17 and the signal latched at each flipflop F/F in the ring delay 13 is provided to the fine delay controller 19. The fine delay controller 19 determines the flipflop F/F number at which the pulse generated in the pulse generator 12 is latched in turning on a switching unit in the second switching part 18 for making a fine delay of the clock signal corresponding to the number (fCLK) and providing the clock signal. The clock signal from the second switching part 18 is naturally delayed for a time period d2 before provided to the output buffer.

The aforementioned preferred embodiment of a device for delaying a clock signal has the following advantages.

In order to obtain a fine time delay, a time delay in unit delay should be short and, in order to have a great operation range, there should be a many number N of unit delays. However, in the background art, since the DTC and TDC require the same numbers of unit delays, requiring a 2N number of total unit delays in the delay line and an N number of flipflops for processing data, the delay line consumes much silicon area. However, since the unit delays in the present invention are in a ring form, a fine delay and a great operation range can be obtained and an area occupied by the delay line can be reduced significantly. In other words, if it is assumed that unit delays each with a time delay of 0.1 ns are used both in the background art and in the present invention, in order to obtain an operation range of 10 ns, the background art requires about 200 unit delays whereas the present invention only requires 8 unit delays as shown in FIG. 6. Accordingly, in the present invention, an area occupied by the delay line can be reduced significantly.

It will be apparent to those skilled in the art that various modifications and variations can be made in the device for delaying a clock signal of the present invention without departing from the spirit or scope of the invention. Thus, it is intended that the present invention cover the modifications and variations of this invention provided they come within the scope of the appended claims and their equivalents.

What is claimed is:

1. A device for delaying a clock signal comprising:

a delay for delaying an external clock signal eCLK up to a delay d1+d2, wherein the delay d1 is a natural delay incurred on reception and the delay d2 is a natural delay incurred on driving an output buffer;

a pulse generator for receiving a clock signal from the delay and generating pulse signals synchronous to rising edges;

a ring delay having a plurality of unit delays connected in a ring form for delaying and circulating the pulse signals generated in the pulse generator as well as latching a signal from each unit delay synchronous to a clock signal rCLK received in the device wherein the clock signal rCLK is derived from the external clock signal eCLK plus the delay d1;

a first clock signal delay for making a course delay of the clock signal rCLK corresponding to a number of circulation;

a second clock signal delay for making a fine delay of the clock signal rCLK delayed by the course delay from the first clock signal delay in response to a latch signal from the ring delay; and, a reset signal generator for resetting the ring delay and the first, and second clock signal delays in response to the clock signal rCLK.

2. A device for delaying a clock signal as claimed in claim 1, wherein the first clock signal delay includes;

a course delay having a plurality of course delay units CDU, each course delay unit delaying the clock signal rCLK by a fixed delay, a first switching part for switching respective outputs of the course delay units CDU in the course delay, and a course delay controller for controlling the first switching part so as to count the number of circulation of the pulse signals from the pulse generator in the ring delay for making the course delay for a time period corresponding to the number.

3. A device for delaying a clock signal as claimed in claim 1, wherein the second clock signal delay includes;

a fine delay having a number of fine delay units FDUs for making fine delay of the delayed clock signal rCLK from the first clock signal delay, a second switching part for respectively switching outputs of the fine delay units FDUs in the fine delay, and a fine delay controller for controlling the second switching part for making the fine delay of the delayed clock signal rCLK received from the first clock signal delay for a time period corresponding to each latch signal from the ring delay.

4. A device for delaying a clock signal as claimed in claim 1, wherein the ring delay includes, the plurality of unit delays connected in series between a first unit delay and a last unit delay in the plurality of unit delays, wherein the last unit delay is further connected in series to the first unit delay for circulating and delaying the pulse signals generated in the pulse generator, and a plurality of latches each for latching a signal from each unit delay synchronous to the clock signal rCLK.

5. A device for delaying a clock signal as claimed in claim 4, wherein the plurality of latches includes flipflops.

6. A device for delaying a clock signal as claimed in claim 1, wherein the ring delay provides a signal corresponding to one circulation of the pulse signals to the first clock signal delay every time the pulse signals make one circulation and provides all latched signals to the second clock signal delay.

* * * * *